(12) United States Patent
Fung et al.

(10) Patent No.: US 12,733,270 B2
(45) Date of Patent: Sep. 8, 2026

(54) CMOS IMAGE SENSOR WHEREIN THE ISOLATION STRUCTURE HAS TWO STI AND BACKSIDE TRENCH ISOLATION

(71) Applicant: Samsung Electronics Co., Ltd., Suwon-si (KR)

(72) Inventors: Tze Ching Fung, Diamond Bar, CA (US); Yibing Michelle Wang, Temple City, CA (US)

(73) Assignee: SAMSUNG ELECTRONICS CO., LTD. (KR)

(*) Notice: Subject to any disclaimer, the term of this patent is extended or adjusted under 35 U.S.C. 154(b) by 651 days.

(21) Appl. No.: 18/096,012

(22) Filed: Jan. 11, 2023

(65) Prior Publication Data

US 2024/0153983 A1 May 9, 2024

Related U.S. Application Data

(60) Provisional application No. 63/423,798, filed on Nov. 8, 2022.

(51) Int. Cl.
*H10F 39/18* (2025.01)
*H10F 30/225* (2025.01)
*H10F 39/00* (2025.01)

(52) U.S. Cl.
CPC ......... *H10F 39/18* (2025.01); *H10F 39/8037* (2025.01); *H10F 39/807* (2025.01); *H10F 39/811* (2025.01)

(58) Field of Classification Search
CPC ...... H10F 30/225; H10F 39/18; H10F 39/802; H10F 39/39; H10F 39/8033; H10F 39/8037; H10F 39/807; H10F 39/811
See application file for complete search history.

(56) References Cited

U.S. PATENT DOCUMENTS 11,296,137 B2 * 4/2022 Finkelstein ......... H01L 27/1463
11,444,108 B2 9/2022 Mun et al.
(Continued)

FOREIGN PATENT DOCUMENTS

CN 114551631 A 5/2022
EP 1 750 308 A2 * 7/2007 ........... H10F 39/026
WO 2022201797 A1 9/2022

OTHER PUBLICATIONS

European Extended Search Report for Application No. 23205785.1, mailed Mar. 19, 2024.

*Primary Examiner* — Wael M Fahmy
*Assistant Examiner* — Alice W Tang
(74) *Attorney, Agent, or Firm* — Renaissance IP Law Group LLP

(57) ABSTRACT

A pixel cell for a CMOS image sensor includes an isolation structure that isolates a pixel transistor region from a pixel photodiode region. On a front side of the image sensor, the isolation structure includes a first shallow trench isolation (STI) structure, a second STI structure and a semiconductor region between the first STI structure and the second STI structure, and an implant region formed from a p-type semiconductor that is in contact with the semiconductor region and extends toward a backside of the image sensor. The semiconductor region is formed from the first type semiconductor. On a backside of the image sensor, the isolation structure includes a trench isolation structure extending from the backside toward the front side and that contacts the implant region.

20 Claims, 12 Drawing Sheets

(56) References Cited

U.S. PATENT DOCUMENTS

| | | | |
|---|---|---|---|
| 11,450,696 | B1 | 9/2022 | Zang et al. |
| 2007/0045679 | A1* | 3/2007 | McKee et al. ................ 257/291 |
| 2009/0230394 | A1* | 9/2009 | Nagaraja et al. ............... 257/59 |
| 2013/0193546 | A1 | 8/2013 | Webster et al. |
| 2020/0020734 | A1* | 1/2020 | Wang et al. ...... H01L 27/14636 |
| 2021/0343765 | A1* | 11/2021 | Gu .................... H01L 27/14607 |
| 2022/0013551 | A1 | 1/2022 | Mun et al. |
| 2022/0293457 | A1 | 9/2022 | Chou et al. |

* cited by examiner

VIEW A-A'

VIEW B-B'

CMOS IMAGE SENSOR WHEREIN THE ISOLATION STRUCTURE HAS TWO STI AND BACKSIDE TRENCH ISOLATION

CROSS-REFERENCE TO RELATED APPLICATION

This application claims the priority benefit under 35 U.S.C. § 119(e) of U.S. Provisional Patent Application No. 63/423,798, filed on Nov. 8, 2022, the disclosure of which is incorporated herein by reference in its entirety.

TECHNICAL FIELD

The subject matter disclosed herein relates to image sensors. More particularly, the subject matter disclosed herein relates to an image sensor that includes an isolation structure that isolates in-pixel CMOS circuitry from a photodiode according to the subject matter disclosed herein.

BACKGROUND

Designing a high-resolution sensor array having a SPAD (single photon avalanche diode) pixel may be challenging because the pixel size cannot be scaled down easily even when the sensor array is fabricated using an advanced process node. A SPAD operates at high voltage (HV) and its size is usually relatively large. It is desirable to make a SPAD as compact as possible to fit the pixel into a given target application. Due to the HV operation, foundry design rules involve certain spacing to prevent breakdown between SPAD and neighboring devices. A sensor design often involves transistor circuits that are to be placed together with SPAD in a pixel, and the foundry design rules normally creates empty space regions, resulting in a sensor circuit that is not relatively compact. Also, there may also be a leakage issue with the HV operation of a SPAD. To prevent leakage there should be sufficient isolation between SPAD and surrounding transistors. The electrical isolation easier to work with NMOS or PMOS, but not both types in a CMOS configuration. Additionally, integrating PMOS with a SPAD may be more challenging due to a punch-through leakage between a SPAD cathode and an N-well. To provide sufficient electrical isolation, a wide separation is required between a SPAD cathode and an N-well, which also results in a large pixel pitch and lower fill-factor. NMOS is easier to isolate from a SPAD than PMOS, so a SPAD pixel circuit is often designed with an NMOS-only circuit. Even so, the idle current is greater for NMOS-only circuits than for CMOS circuits, which leads to a higher power consumption for NMOS-only circuits. Being limited to one type of semiconductor transistor may be a disadvantage because the power consumption is not ideal.

An alternative conventional design approach is that the CMOS transistor circuitry may be moved to another wafer (a stacked configuration) in which one layer of the stacked configuration is a SPAD array and on the other layer includes the CMOS transistor circuitry. This type of structure, however, is expensive to fabricate.

SUMMARY

An example embodiment provides a pixel cell for a CMOS image sensor that may include a semiconductor substrate, a first pixel region, a pixel transistor region, and an isolation structure. The semiconductor substrate may include a first side and a second side that is opposite the first side. The first pixel region may include at least one first photodiode in which the first photodiode may include a first region formed from a first type semiconductor on the first side of the semiconductor substrate and a second region formed from a second type semiconductor on the first side of the semiconductor substrate. The pixel transistor region may include at least one transistor, and the isolation structure may isolate the pixel transistor region from the first photodiode in which the isolation structure on the first side of the semiconductor substrate may include a first shallow trench isolation structure that is proximate to the second region of the first photodiode, a third region formed from the first type semiconductor that is proximate to the first shallow trench isolation structure, a second shallow trench isolation structure that is proximate to the third region and that is proximate to the pixel transistor region, and an implant region formed from the first type semiconductor that is in contact with the third region and extends toward the second side of the semiconductor substrate. In one embodiment, the pixel cell may further include a trench isolation structure extending from the second side toward the first side of the semiconductor substrate to contact the implant region. In another embodiment, the first photodiode may include an avalanche diode or a single photon avalanche diode. In still another embodiment, the first type semiconductor may be a p-type semiconductor, and the second type semiconductor may be an n-type semiconductor. In yet another embodiment, the first region may include an anode and the second region may include a cathode that is shared with a second photodiode of the first pixel region. In one embodiment, the second region forms a ring around the first region, and the first pixel region may further include a fourth region that is between the first region and the second side of the semiconductor substrate and is formed from the second type semiconductor in which the fourth region may contact the ring formed by the second region. In another embodiment, the fourth region contacts the ring formed by the second region to enclose the first region. In still another embodiment, the second region and the fourth region may be shared with a second photodiode of the first pixel region. In yet another embodiment, the pixel cell may further include a second pixel region that includes at least one second photodiode, the second photodiode of the second pixel region may include a fourth region formed from the first type semiconductor on the first side of the semiconductor substrate and a fifth region formed from the second type semiconductor formed on the first side of the semiconductor substrate, the pixel transistor region may be disposed between the first pixel region and the second pixel region, and the isolation structure may further isolate the pixel transistor region from the second photodiode.

An example embodiment provides a pixel cell for a CMOS image sensor that may include a semiconductor substrate, a first pixel region, a second pixel region, a pixel transistor region, and an isolation structure. The semiconductor substrate may have a first side and a second side that is opposite the first side. The first pixel region may include at least one first photodiode in which the first photodiode may include a first region formed from a first type semiconductor on the first side of the semiconductor substrate and a second region formed from a second type semiconductor on the first side of the semiconductor substrate. The second pixel region may include at least one second photodiode in which the second photodiode may include a third region formed from the first type semiconductor on the first side of the semiconductor substrate and a fourth region formed from the second type semiconductor on the first side of the semiconductor substrate. The pixel transistor region may be disposed between the first pixel region and the second pixel region, and the pixel transistor region may include at least one transistor. The isolation structure may enclose and isolate the pixel transistor region from the first photodiode and the second photodiode, in which the isolation structure on the first side of the semiconductor substrate may include a first shallow trench isolation structure, a second shallow trench isolation structure, a fifth region between the first shallow trench isolation structure and the second shallow trench isolation structure that is formed from the first type semiconductor, and an implant region formed from the first type semiconductor that may be in contact with the fifth region and extends toward the second side of the semiconductor substrate. In one embodiment, the pixel cell may further include a trench isolation structure that may extend from the second side toward the first side of the semiconductor substrate to contact the implant region. In another embodiment, the first photodiode may include an avalanche diode or a single photon avalanche diode. In still another embodiment, the first type semiconductor may be a p-type semiconductor, and the second type semiconductor may be an n-type semiconductor. In yet another embodiment, the first region may include an anode and the second region may include a cathode that is shared with another first photodiode of the first pixel region, and the third region may include an anode and the fourth region may include a cathode that is shared with another second photodiode of the second pixel region. In one embodiment, the second region may form a first ring around the first region and the fourth region may form a second ring around the third region, and the first pixel region may further include a sixth region that is between the first region and the second side of the semiconductor substrate and that may be formed from the second type semiconductor in which the sixth region may contact the first ring formed by the second region, and a seventh region that is between the third region and the second side of the semiconductor substrate and may be formed from the second type semiconductor in which the seventh region may contact the second ring formed by the fourth region. In another embodiment, the second region and the sixth region may be shared with another first photodiode of the first pixel region.

An example embodiment provides a pixel cell for a CMOS image sensor that may include a semiconductor substrate, a first pixel region, a pixel transistor region, and an isolation structure. The semiconductor substrate may have a first side and a second side that is opposite the first side. The first pixel region may include at least one first photodiode. The pixel transistor region may be disposed between the first pixel region and the pixel transistor region may include at least one transistor. The isolation structure may enclose the first pixel region and may isolate the pixel transistor region from the first pixel region in which the isolation structure on the first side of the semiconductor substrate may include a first shallow trench isolation structure, a second shallow trench isolation structure and a first region between the first shallow trench isolation structure and the second shallow trench isolation structure that may be formed from a first type semiconductor, and an implant region that may be formed from the first type semiconductor that is in contact with the first region and that may extend toward the second side of the semiconductor substrate. In one embodiment, the pixel cell may further include a trench isolation structure that may extend from the second side toward the first side of the semiconductor substrate to contact the implant region. In another embodiment, the first photodiode may include a single photon avalanche diode, and the first type semiconductor may be a p-type semiconductor. In still another embodiment, the at least one transistor may be part of a CMOS transistor circuit.

BRIEF DESCRIPTION OF THE DRAWING

In the following section, the aspects of the subject matter disclosed herein will be described with reference to exemplary embodiments illustrated in the figure, in which.

DETAILED DESCRIPTION

Figure 1A:
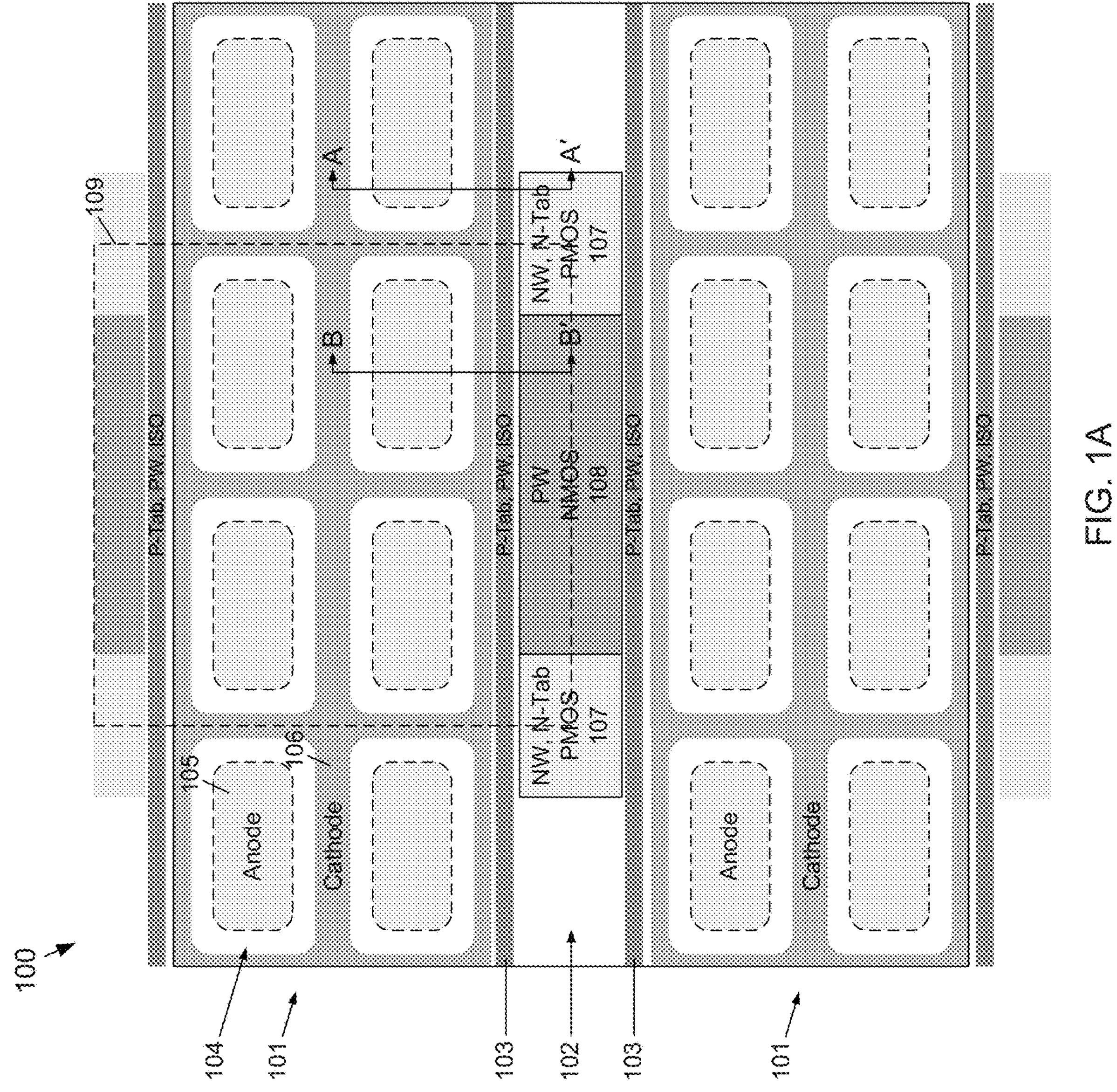
FIG. 1A depicts is a top view of an example embodiment of an image sensor according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

The subject matter disclosed herein provides a SPAD pixel structure having a high fill factor and that has a compact integration with CMOS in-pixel circuits. In one embodiment, a SPAD may include a cathode ring that may be shared with neighboring SPADs of an array. The SPAD pixel structure also includes a common SPAD deep-cathode that is in contact with the ring cathode and that may also be shared cross an entire SPAD array. A spatially narrow structure may be included in the SPAD pixel structure that may provide electrical isolation between the SPAD and the in-pixel CMOS circuits.

The subject matter disclosed herein provides a CMOS capability (both NMOS and PMOS) that may be fabricated together with a SPAD. In one embodiment, a SPAD pixel includes an isolation structure that includes an implant structure that allows CMOS circuitry to be placed closer to one or more SPADs without necessitating extra spacing.

One example embodiment a SPAD pixel that includes a SPAD and CMOS in-pixel transistors having a high fill-factor and that are placed on same wafer. The SPAD pixel may have a cathode electrode that may be a shared cathode electrode across the array and a spatially narrow structure for electrical isolation between SPAD and CMOS pixel circuits. The pixel may be illuminated from back side to maximize the effective fill-factor because wiring layers may be formed on the front side of the SPAD structure.

Another example embodiment provides an isolation ring that in a top view encircles a pixel circuit region that may include CMOS transistor circuitry. A cross-section view of the isolation ring structure includes isolation in x and y directions. In the x-direction, the isolation ring includes a first Shallow Trench Isolation (STI), a p-type implant well (PW), and a second STI between a SPAD region and the CMOS transistor circuitry region. In the y-direction, the isolation ring includes the p-type well, a p-type isolation implant region (ISO), and an optional Backside Trench Isolation (BTI), in which the BTI contacts the implant region of the ISO region. NMOS and PMOS transistors may formed to be close together in a pixel circuit area. In one embodiment, the pixel circuit area may be formed within a SPAD pixel array.

The subject matter disclosed herein provides an advantage that both PMOS+NMOS may be used, which results in an image sensor having lower power consumption characteristic. Moreover, an image sensor formed using the techniques disclosed here uses less area, thereby providing an image sensor having a better fill factor than a conventionally formed image sensor.

One example embodiment includes a pixel architecture that may include: a SPAD array, an isolation layer, and a CMOS pixel circuit in which the isolation layer may further include a STI notch, a p-type implant well, a second STI notch, and an isolation implant region. The first STI may be adjacent to the PW on one side, and the second STI may be adjacent to the PW on an opposite side. The PW may be stacked on top of the ISO. The ISO may be further stacked on top of a backside trench isolation region.

Another example embodiment includes a SPAD pixel structure that may include a SPAD with anode, cathode ring and a deep cathode in which the cathode may be shared with neighboring pixels; a CMOS pixel circuit areas including both NMOS and PMOS; an isolation structure placed in between the SPAD and circuit regions; an isolation structure that may include a STI, a p-tab contact and a p-type implant well. The isolation PW and NMOS PW can be contiguous. In one embodiment, an isolation structure may include a deeper p-type isolation implant underneath the PW to prevent punch-through between cathode and NW. An ISO implant may coincide the backside trench isolation. A backside illumination (BSI) structure having microlenses on the backside may further enhance the effective fill factor of SPAD.

FIG. 1A depicts is a top view of an example embodiment of an image sensor 100 according to the subject matter disclosed herein. The image sensor 100 includes one or more pixel regions 101, one or more pixel transistor regions 102 and one or more isolation structures 103 that isolate a pixel region 101 from a pixel transistor region 102. A pixel region 101 may include one or more photodiodes 104 (i.e., a photodiode array) in which only one photodiode 104 is indicated. Each photodiode 104 may include an anode region 105 and a cathode region 106, of which only one anode region 105 is indicated. The cathode region 106 may formed into a ring around an anode region 105 and be shared between two or more photodiodes 104. In one example embodiment, the photodiodes 104 may be avalanche diodes. In another example embodiment, the photodiodes 104 may be single photon avalanche diodes (SPADs).

A pixel transistor region 102 may include N-well regions 107 and P-well regions 108 that may be configured to form one or more CMOS transistor circuits. In one embodiment, the dashed box 109 defines a boundary of a single unit pixel that includes both a photodiode array and a CMOS pixel circuit. In one embodiment, a pixel transistor region 102 may include CMOS transistor circuits in which each CMOS transistor circuit corresponds to a unit pixel.

The isolation structure 103 isolates a pixel transistor region 102 from a pixel region 101. In one embodiment, an isolation structure 103 may extend from one side to another side of a SPAD pixel array 101. Two such isolation structures 103 may be used to form a narrow region into which CMOS circuitry may be formed. In another embodiment, an isolation structure 103 may enclose and isolate a pixel transistor region 102 (i.e., an in-pixel transistor region) from one or more pixel regions 101 that, for example, surrounds the pixel transistor region 102. In still another embodiment, an isolation structure 103 may enclose a pixel region 101 and isolate the pixel region 101 from a pixel transistor region 102 (and from other pixel regions 101). In yet another embodiment, an isolation structure 103 may enclose a pixel transistor region 102 and may also enclose a pixel region 101 so that the pixel region 102 is isolated from a pixel region 101 and so that the pixel region 101 is isolated from other pixel regions 101.

Figure 1B:
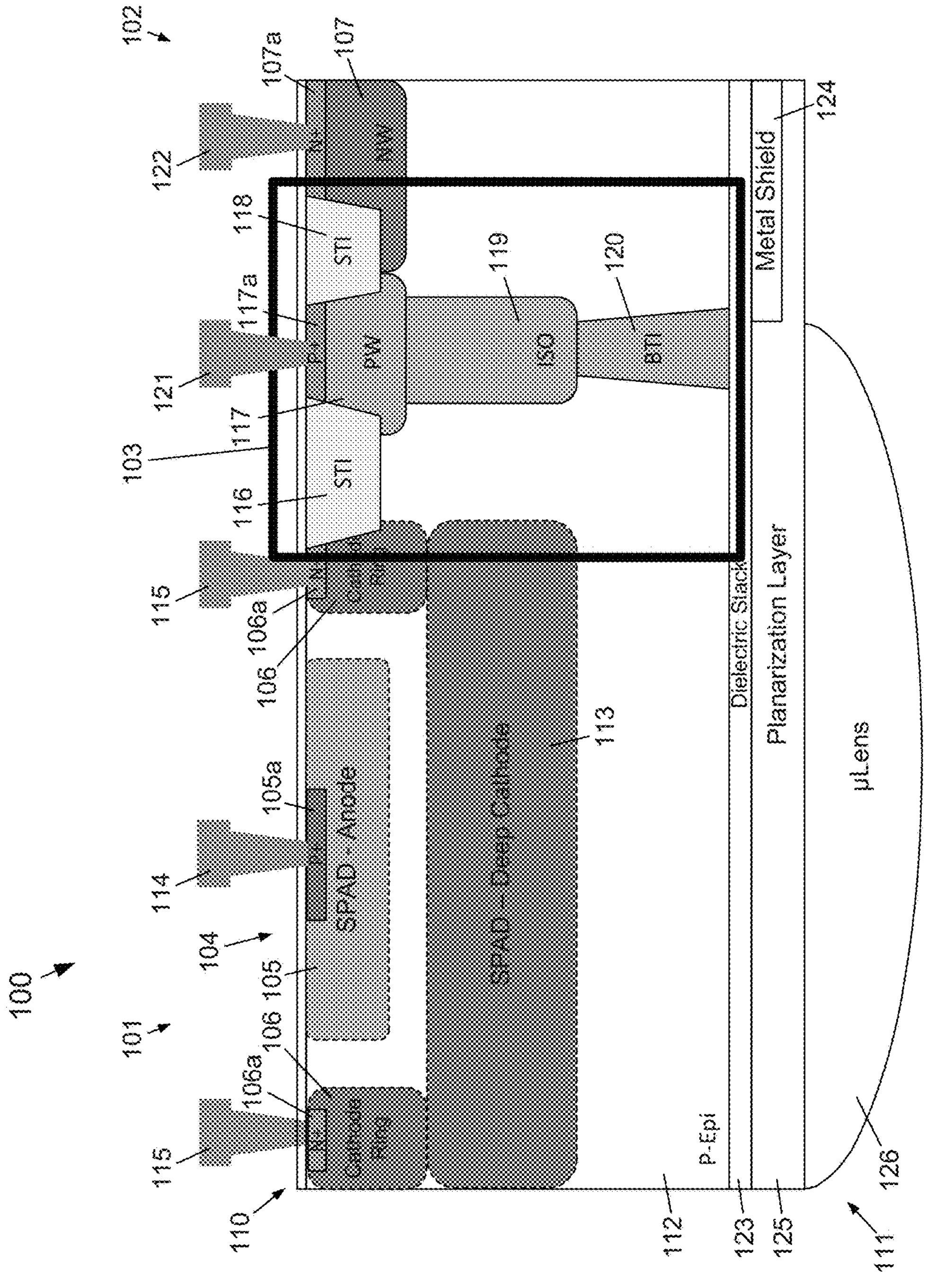
FIG. 1B depicts a cross-sectional view of the image sensor taken along line AA' in FIG. 1A.

FIG. 1B depicts a cross-sectional view of the image sensor 100 taken along line AA' in FIG. 1A. In the cross-sectional view of FIG. 1B, a front side 110 of the image sensor 100 is depicted toward the top of FIG. 1B, and a back side 111 of the image sensor 100 is depicted toward the bottom of FIG. 1B. The image sensor 100 may be formed in a P-Epi semiconductor substrate 112. The cross-sectional view also depicts, from left to right along the front side 110 of the image sensor 100 a photodiode 104, the isolation structure 103, and a portion of a pixel transistor region 102.

The anode 105 of the photodiode 104 is a P-well region that may include a P+ doped region 105*a*. The cathode 106 of the photodiode 104 is an N-well region that may include an N+ doped region 106*a*. A n-type semiconductor deep cathode 113 is between the anode 105 and the back side 111 of the image sensor 100. The deep cathode 113 is in contact with the ring cathode 106. A P-Epi semiconductor region may be between the anode 105 and the deep cathode 113. A contact terminal 114 may be formed on the P+ doped region 105*a*, and one or more contact terminals 115 may be formed on the N+ doped regions 106*a*.

The isolation structure 103 isolates a pixel transistor region 102 from a pixel region 101. In one embodiment, the isolation structure 103 may enclose and isolate a pixel transistor region 102 (i.e., an in-pixel transistor region) from one or more pixel regions 101 that, for example, surround the pixel transistor region 102. In another embodiment, the isolation structure 103 may be configured to form an isolation barrier on one or more sides of a pixel transistor region 102. In still another embodiment, an isolation structure 103 may enclose a pixel region 101 and isolate the pixel region 101 from a pixel transistor region 102 (and from other pixel regions 101). In yet another embodiment, an isolation structure 103 may enclose a pixel transistor region 102 and may also enclose a pixel region 101 so that the pixel region 102 is isolated from a pixel region 101 and so that the pixel region 101 is isolated from other pixel regions 101.

The isolation structure 103 may include a first shallow trench isolation (STI) structure 116, a P-well region 117, a P+ region 117*a* and a second STI structure 118 that are formed on the front side 110 of the image sensor 100. The first STI structure 116 is proximate to and contacts the ring cathode 106. The P-well region 117 is proximate to and contacts the first STI structure 116. The P+ region 117*a* is also proximate to and contacts the first STI structure 116. The second STI structure 118 is proximate to and contacts the P-well region 117 and the P+ region 117*a*. A p-type isolation implant region (ISO) structure 119 may be formed below and in contact with the P-well region 117 An optional back-side trench isolation (BTI) structure 120 may be formed below and in contact with the ISO structure 119. When used the BTI structure 120 extends from the back side 111 of the image sensor 100 to the ISO structure 119. A contact terminal 121 may be formed on the P-well region 117.

Figure 1C:
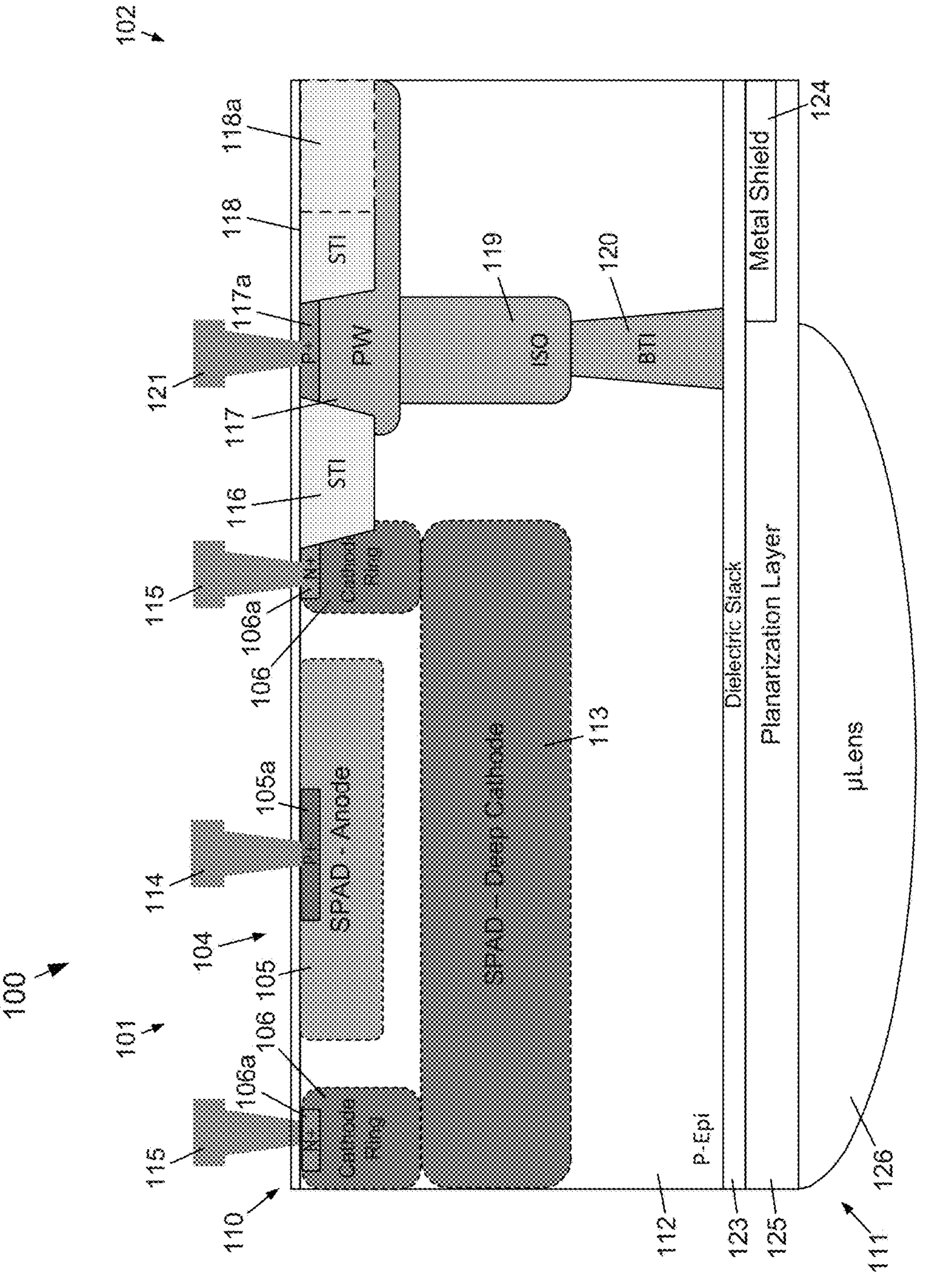
FIG. 1C depicts a cross-sectional view of the image sensor taken along line BB' in FIG. 1A.

FIG. 1C depicts a cross-sectional view of the image sensor 100 taken along line BB' in FIG. 1A. The region 118*a* may be either a STI structure or an NMOS region.

The portion of the pixel transistor region 102 depicted in FIG. 1A includes a N-well region 107 that is in contact with P-well region 117 and the second STI structure 118. The N-well region 107 may include an N+ doped region 107*a*, and a terminal contact 122 may be formed on the N+ doped region 107*a*. P-well regions may also be formed in the pixel transistor region 102. The N-well and P-well regions may form transistor CMOS circuitry.

An dielectric stack 123 may be formed on the backside surface 111. The dielectric stack 123 may include one or more dielectric layers for Si passivation and for optical purposes, such as anti-reflection. A metal shield 124 may be formed in one or more selected locations on the backside surface 111 of the sensor image 100. A planarization layer 125 may be formed on the dielectric stack 123 and the metal shield 124. An array of microlenses 126 may be formed on the planarization layer 125.

Figure 2A:
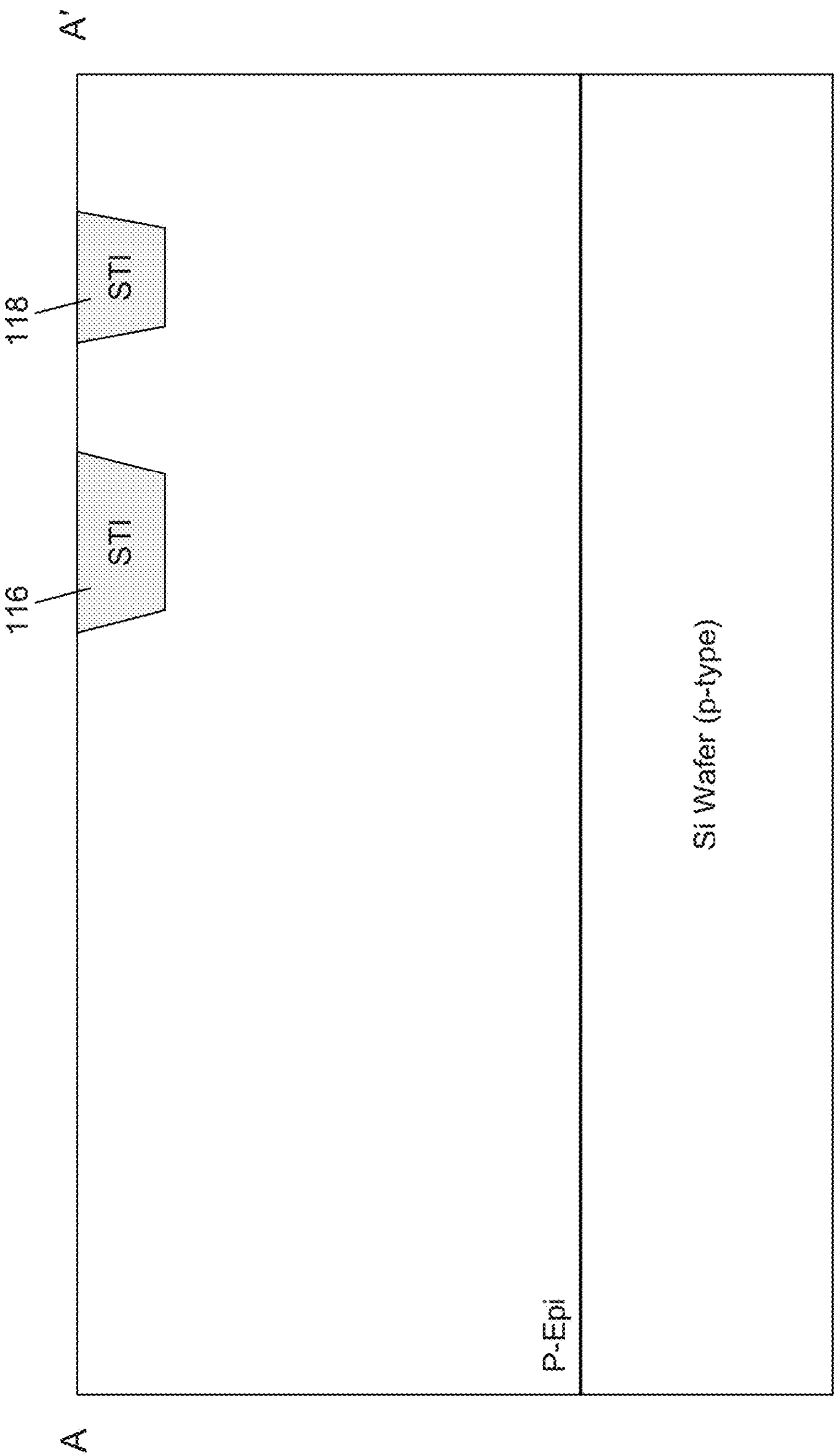
FIGS. 2A-2H depict cross-sectional view of different stages of an example embodiment of a method to fabricate a pixel cell for a CMOS image sensor according to the subject matter disclosed herein.
Figure 2B:
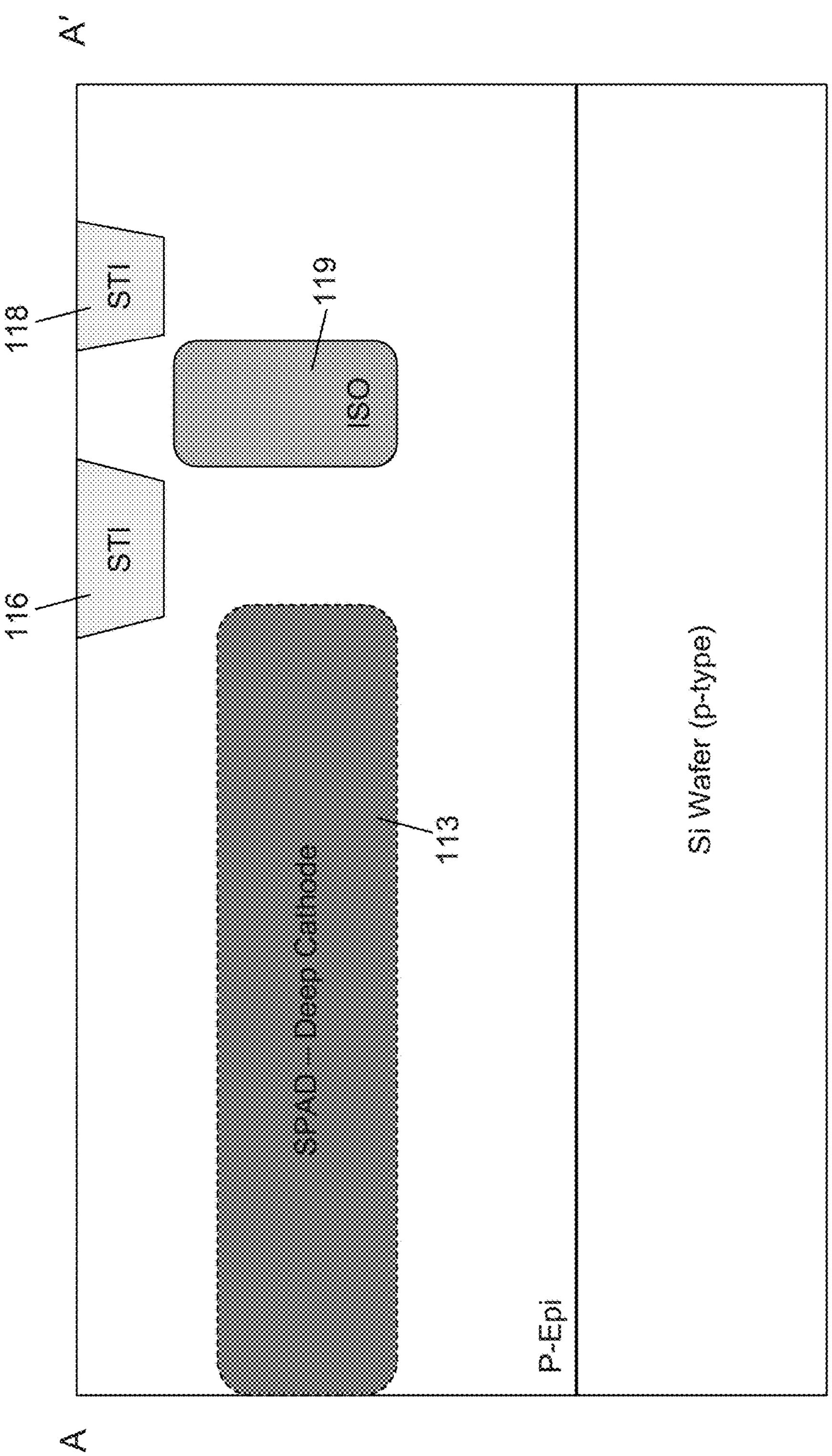

FIGS. 2A-2H depict cross-sectional view of different stages of an example embodiment of a method to fabricate a pixel cell for a CMOS image sensor according to the subject matter disclosed herein. In FIG. 2A, an P-Epi wafer (i.e., a silicon wafer with p-type epitaxial layer grown on top) is etched using a well-known technique to form trenches for STI structures. The STI structures are filled with, for example, an oxide to form STI structures 116 and 118. A chemical mechanical planarization technique may be used to planarize the STI structures with the surface of the wafer. In FIG. 2B, a deep p-type isolation implant formed from, for example, boron (B), and a deep n-type implant formed from, for example, phosphorous (P) or arsenic (As), are both formed using a well-known ion-implantation technique to form the deep isolation region 119 and the deep cathode 113.

Figure 2C:
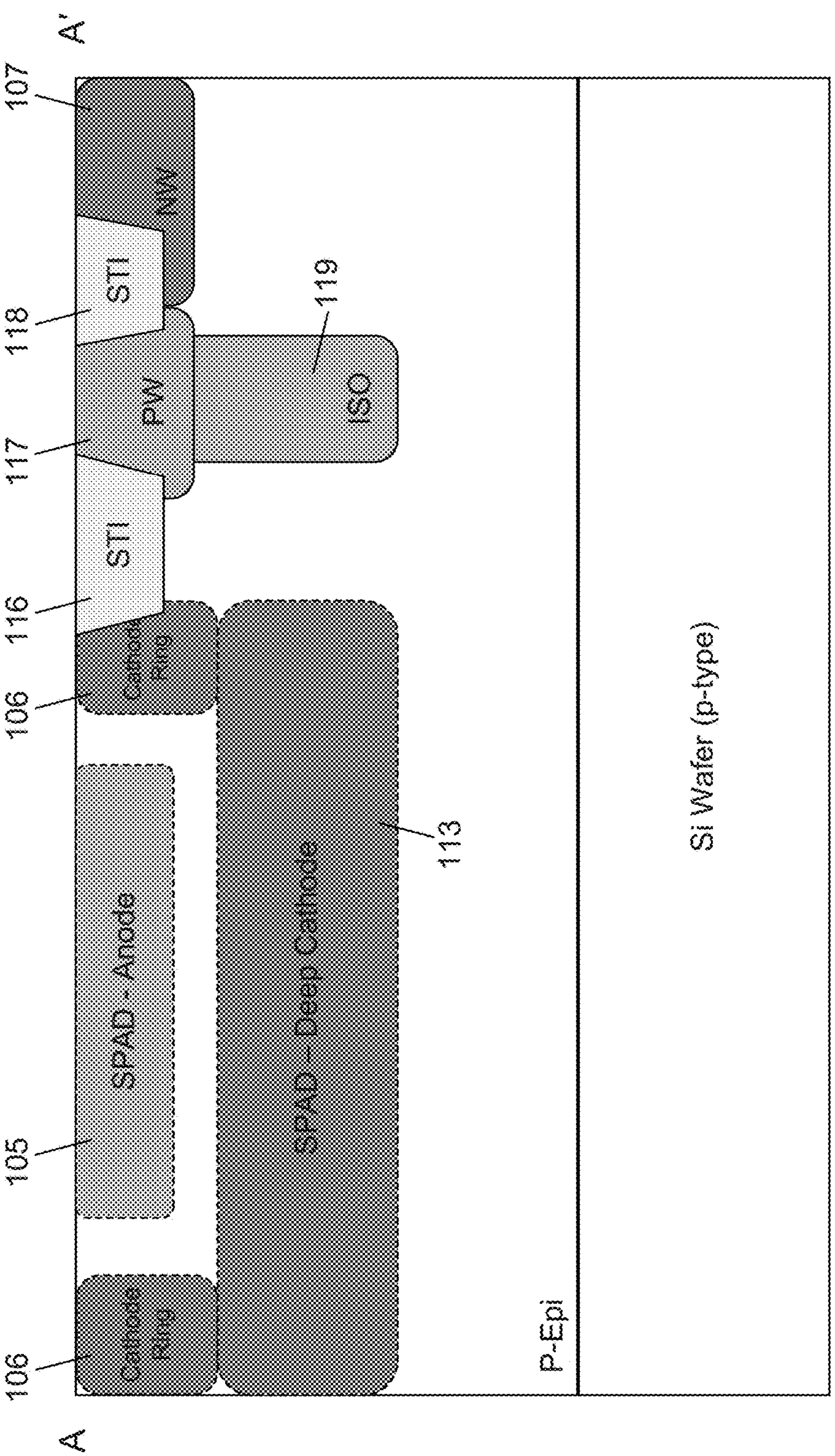
Figure 2D:
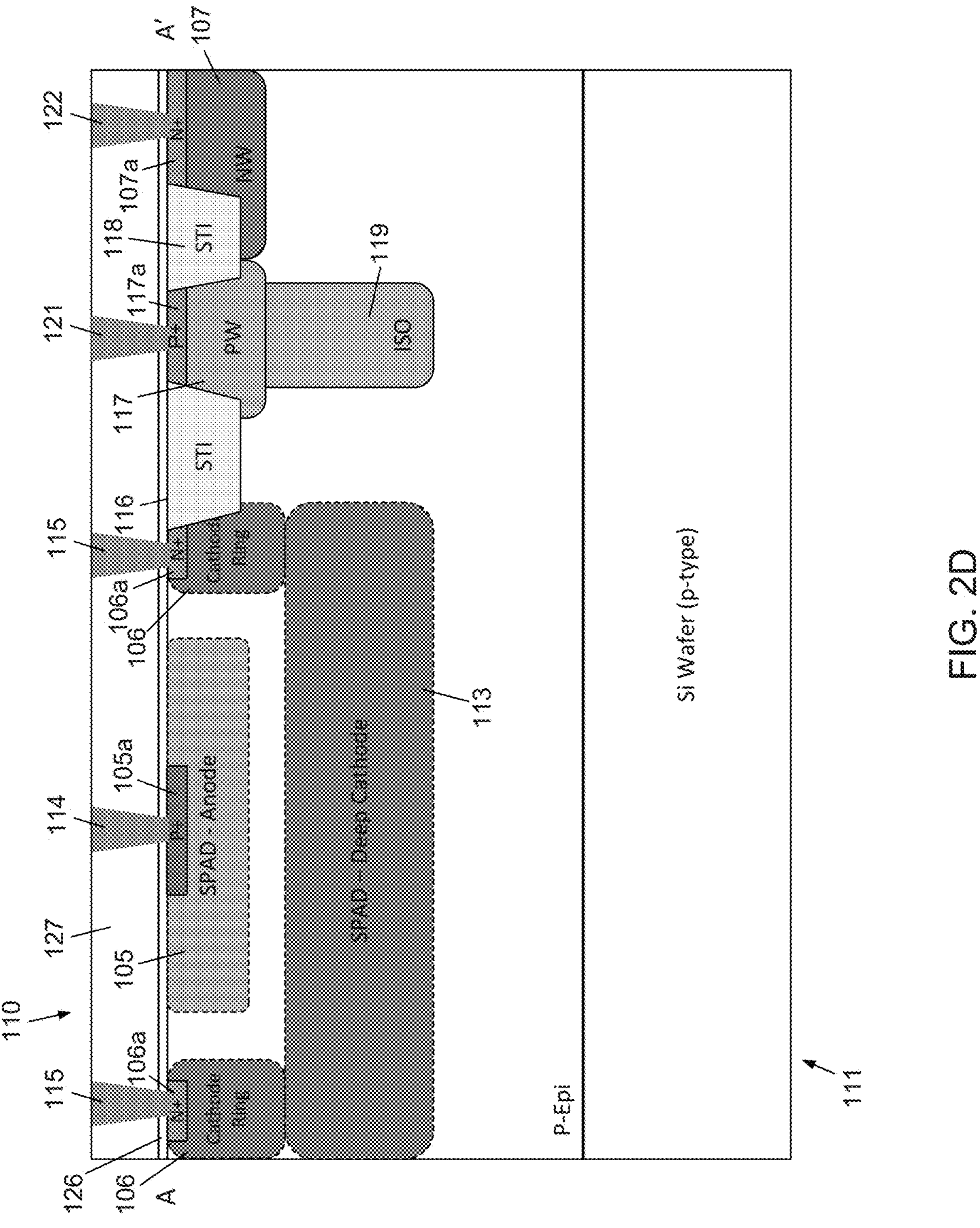

In FIG. 2C, well-known ion-implantation techniques are used for form shallow wells for the photodetector anode region 105, the photodetector cathode regions 106, the P-well region 117, N-well regions 107, and P-well regions 108 (not shown). Typical p-type doping materials may include boron and difluoroboryl radical ($BF_2$), and typical n-type doping materials may include phosphorous and arsenic. In FIG. 2D, an oxide 126, such as $SiO_2$, may be formed on the front side surface 110. The gate oxide 126 may be etched to form gate oxides for transistor circuits. Shallow doping may be implanted to form contact areas 105*a*, 106*a*, 107*a* and 117*a*. Spacers (not shown) may be formed for the gates of transistor circuits. An inter-layer dielectric (ILD) 127 may be formed on the front side surface 110, and contacts 114, 115, 122 and 121 may be respectively formed on the contact areas 105*a*, 106*a*, 107*a* and 117*a*.

Figure 2E:
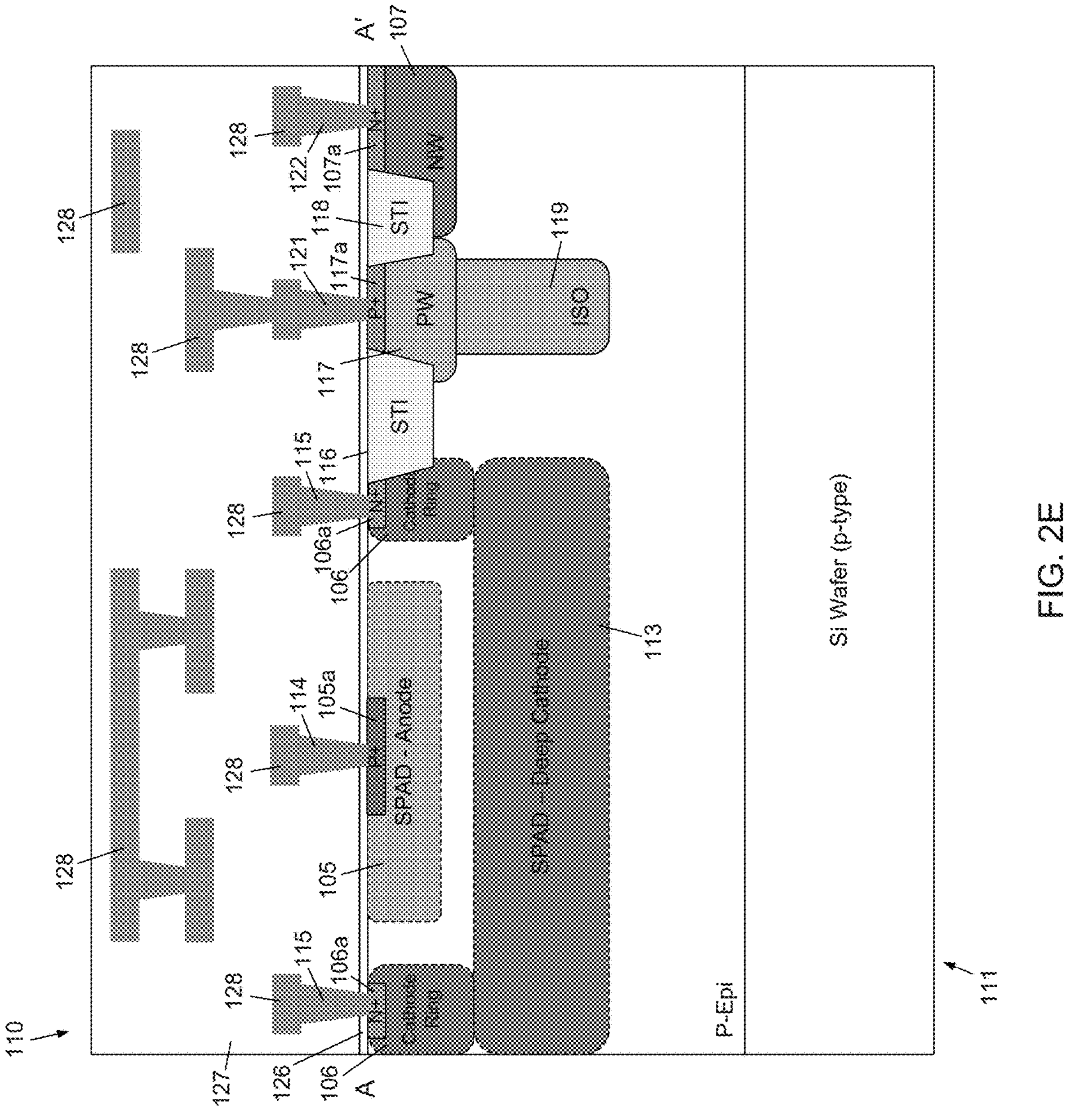
Figure 2F:
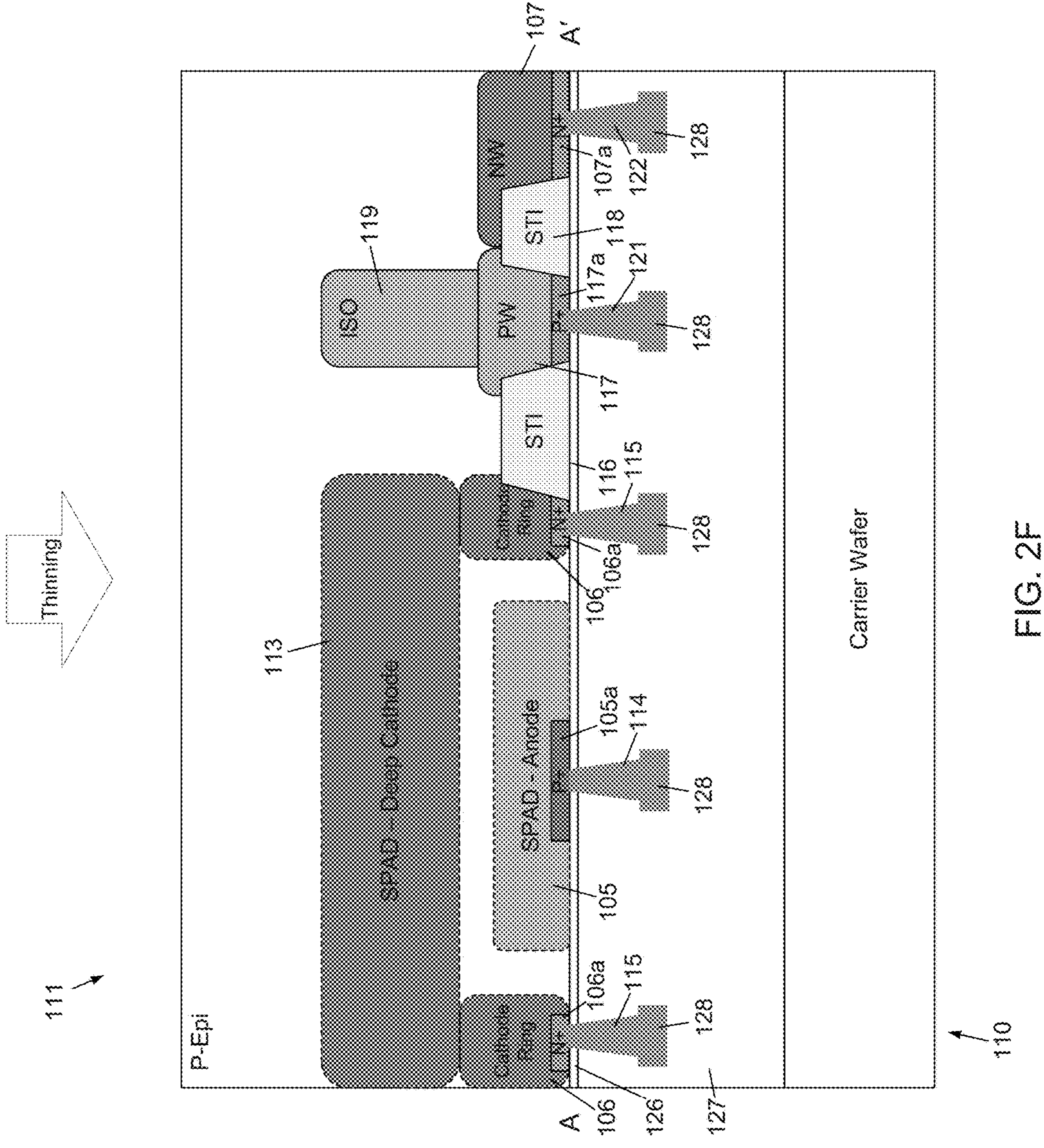
Figure 2G:
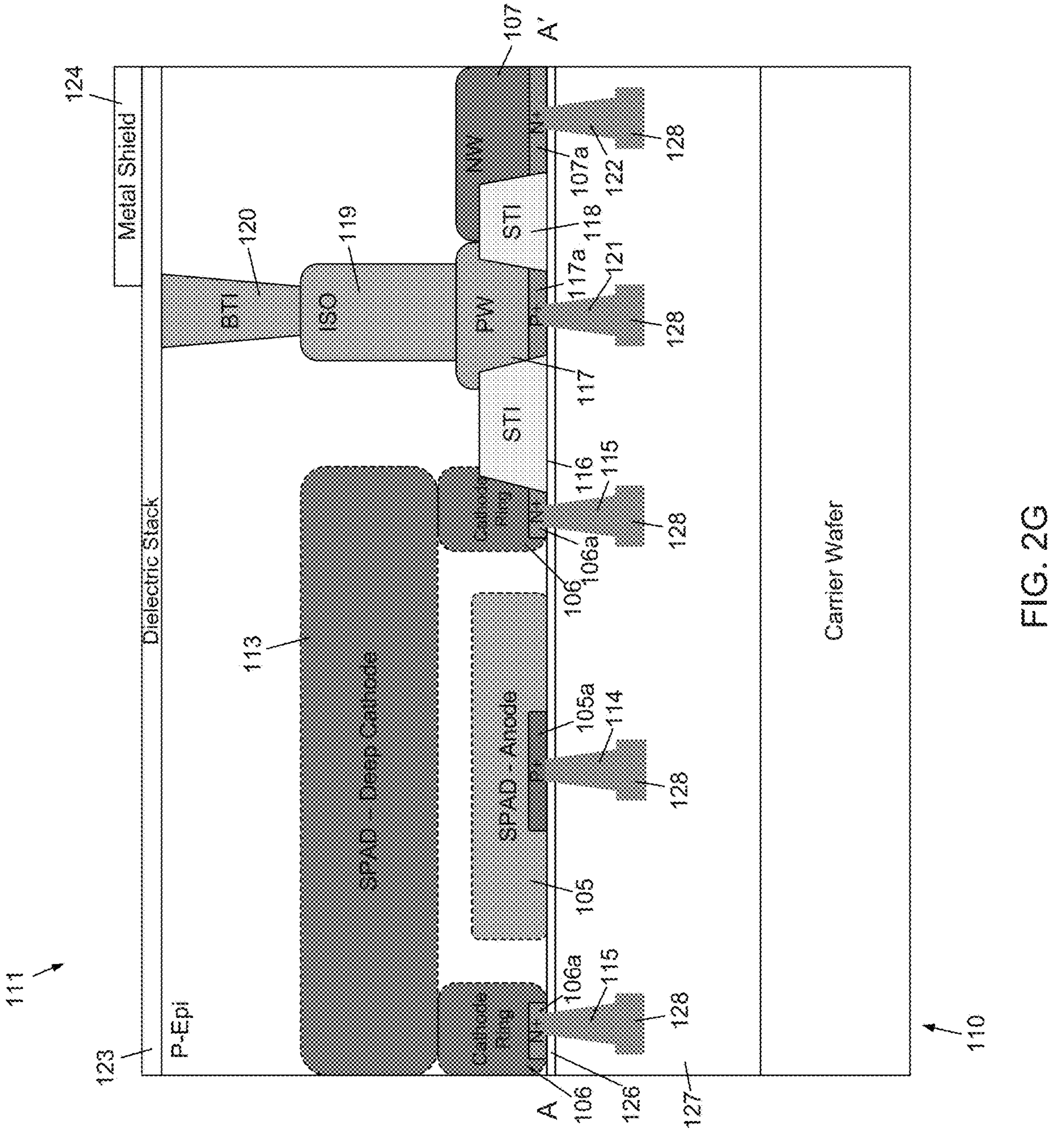
Figure 2H:
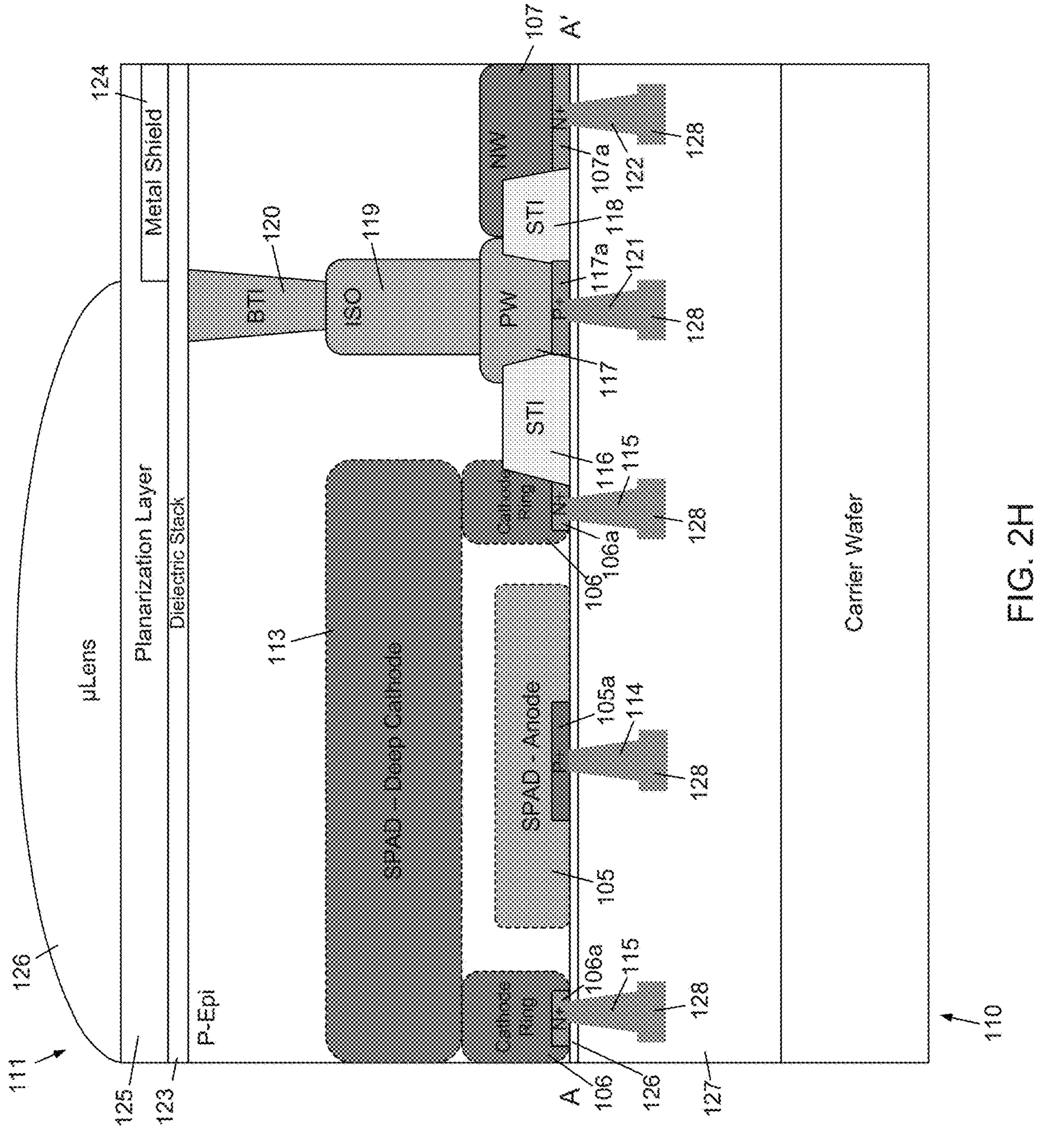

In FIG. 2E, metallization layers 128 may formed. In FIG. 2F, at this step, the wafer front side surface 110 is first bonded to a carrier wafer, the wafer is backside thinned from the back side. In FIG. 2G, a backside trench isolation structure 120 may be formed that extends to and contacts the deep ISO region 119. A dielectric stack 123 may be added, and a metal shield 124 may optionally be added based on the location of the metal shield on the backside surface 111. Anti-reflective layers and/or color filters may optionally be added. In FIG. 2H, a planarization layer 125 is formed on the dielectric stack 123 and metal shield 124, and an array of microlenses 126 may be added to the backside surface 111 of the image sensor 100 on the planarization layer 125.

Figure 3:
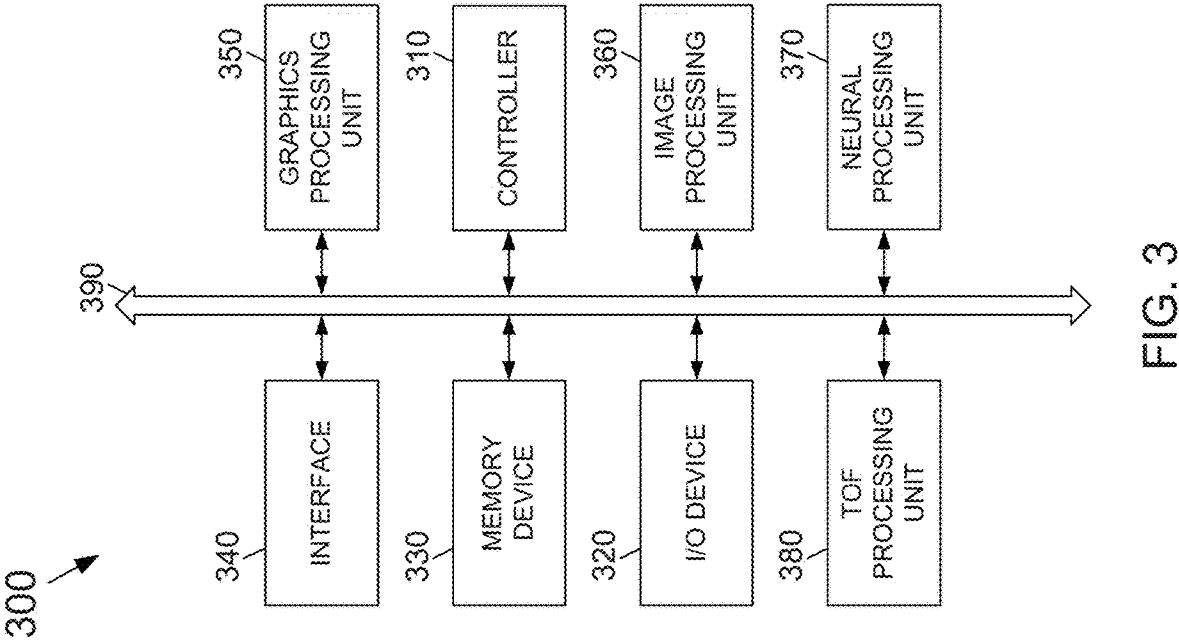
FIG. 3 depicts an electronic device that may include an image sensor that includes an isolation structure according to the subject matter disclosed herein.

FIG. 3 depicts an electronic device 300 that may include an image sensor that includes an isolation structure according to the subject matter disclosed herein. Electronic device 300 and the various system components of electronic device 300 may be formed from one or modules. The electronic device 300 may include a controller (or CPU) 310, an input/output device 320 such as, but not limited to, a keypad, a keyboard, a display, a touch-screen display, a 2D image sensor, a 3D image sensor, a memory 330, an interface 340, a GPU 350, an imaging-processing unit 360, a neural processing unit 370, a TOF processing unit 380 that are coupled to each other through a bus 390. In one embodiment, the 2D image sensor and/or the 3D image sensor may be part of the imaging processing unit 360. In one embodiment, the 3D image sensor may include an isolation structure that isolates in-pixel CMOS circuitry from a photodiode according to the subject matter disclosed herein. In another embodiment, the 3D image sensor may be part of the TOF processing unit 380. The controller 310 may include, for example, at least one microprocessor, at least one digital signal processor, at least one microcontroller, or the like. The memory 330 may be configured to store a command code to be used by the controller 310 and/or to store a user data.

The interface 340 may be configured to include a wireless interface that is configured to transmit data to or receive data from, for example, a wireless communication network using a RF signal. The wireless interface 340 may include, for example, an antenna. The electronic system 300 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), Fifth-Generation Wireless (5G), Sixth-Generation Wireless (6G), and so forth.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A pixel cell for a CMOS image sensor, comprising:

a semiconductor substrate having a first side and a second side that is opposite the first side;

a first pixel region that includes at least one first photodiode, the first photodiode comprising a first region formed from a first type semiconductor on the first side of the semiconductor substrate and a second region formed from a second type semiconductor on the first side of the semiconductor substrate;

a pixel transistor region including at least one transistor; and an isolation structure that isolates the pixel transistor region from the first photodiode, the isolation structure on the first side of the semiconductor substrate comprising a first shallow trench isolation (STI) structure that is proximate to the second region of the first photodiode, a third region formed from the first type semiconductor that is proximate to the first STI structure, a second STI structure that is proximate to the third region and that is proximate to the pixel transistor region, and an implant region formed from the first type semiconductor that is in contact with the third region and extends toward the second side of the semiconductor substrate;

and a backside trench isolation (BTI) structure extending from the second side of the semiconductor substrate toward the implant region and in contact with the implant region, wherein the first STI structure, the third region, the second STI structure, the implant region, and the BTI structure cooperatively form a continuous lateral isolation boundary between the pixel transistor region and the first photodiode.

2. The pixel cell of claim 1, further comprising a trench isolation structure extending from the second side toward the first side of the semiconductor substrate to contact the implant region.

3. The pixel cell of claim 1, wherein the first photodiode comprises an avalanche diode or a single photon avalanche diode (SPAD).

4. The pixel cell of claim 1, wherein the first type semiconductor comprises a p-type semiconductor, and the second type semiconductor comprises an n-type semiconductor.

5. The pixel cell of claim 1, wherein the first region comprises an anode and the second region comprises a cathode that is shared with a second photodiode of the first pixel region.

6. The pixel cell of claim 1, wherein the second region forms a ring around the first region, and the first pixel region further comprises a fourth region that is between the first region and the second side of the semiconductor substrate and is formed from the second type semiconductor, the fourth region contacting the ring formed by the second region.

7. The pixel cell of claim 6, wherein the fourth region contacts the ring formed by the second region to enclose the first region.

8. The pixel cell of claim 6, wherein the second region and the fourth region are shared with a second photodiode of the first pixel region.

9. The pixel cell of claim 1, further comprising a second pixel region that includes at least one second photodiode, the second photodiode of the second pixel region comprising a fourth region formed from the first type semiconductor on the first side of the semiconductor substrate and a fifth region formed from the second type semiconductor formed on the first side of the semiconductor substrate, wherein the pixel transistor region is disposed between the first pixel region and the second pixel region, and the isolation structure further isolates the pixel transistor region from the second photodiode.

10. A pixel cell for a CMOS image sensor, comprising:

a semiconductor substrate having a first side and a second side that is opposite the first side;

a first pixel region that includes at least one first photodiode, the first photodiode comprising a first region formed from a first type semiconductor on the first side of the semiconductor substrate and a second region formed from a second type semiconductor on the first side of the semiconductor substrate;

a second pixel region that includes at least one second photodiode, the second photodiode comprising a third region formed from the first type semiconductor on the first side of the semiconductor substrate and a fourth region formed from the second type semiconductor on the first side of the semiconductor substrate;

a pixel transistor region disposed between the first pixel region and the second pixel region, the pixel transistor region including at least one transistor; and an isolation structure that isolates the pixel transistor region from the first photodiode and the second photodiode, the isolation structure on the first side of the semiconductor substrate comprising a first shallow trench isolation (STI) structure, a second STI structure, a fifth region between the first STI structure and the second STI structure that is formed from the first type semiconductor, and an implant region formed from the first type semiconductor that is in contact with the fifth region and extends toward the second side of the semiconductor substrate;

and a backside trench isolation (BTI) structure extending from the second side of the semiconductor substrate toward the implant region and in contact with the implant region, wherein the first STI structure, the fifth region, the second STI structure, the implant region, and the BTI structure cooperatively form a continuous lateral isolation boundary separating the pixel transistor region from the first photodiode and the second photodiode.

11. The pixel cell of claim 10, further comprising a trench isolation structure extending from the second side toward the first side of the semiconductor substrate to contact the implant region.

12. The pixel cell of claim 10, wherein the first photodiode comprises an avalanche diode or a single photon avalanche diode (SPAD).

13. The pixel cell of claim 10, wherein the first type semiconductor comprises a p-type semiconductor, and the second type semiconductor comprises an n-type semiconductor.

14. The pixel cell of claim 10, wherein the first region comprises an anode and the second region comprises a cathode that is shared with another first photodiode of the first pixel region, and wherein the third region comprises an anode and the fourth region comprises a cathode that is shared with another second photodiode of the second pixel region.

15. The pixel cell of claim 10, wherein the second region forms a first ring around the first region and the fourth region forms a second ring around the third region, the first pixel region further comprising:

a sixth region that is between the first region and the second side of the semiconductor substrate and is formed from the second type semiconductor, the sixth region contacting the first ring formed by the second region; and a seventh region that is between the third region and the second side of the semiconductor substrate and is formed from the second type semiconductor, the seventh region contacting the second ring formed by the fourth region.

16. The pixel cell of claim 15, wherein the second region and the sixth region are shared with another first photodiode of the first pixel region.

17. A pixel cell for a CMOS image sensor, comprising:

a semiconductor substrate having a first side and a second side that is opposite the first side;

a first pixel region that includes at least one first photodiode;

a pixel transistor region disposed between the first pixel region, the pixel transistor region including at least one transistor; and an isolation structure that isolates the pixel transistor region from the first pixel region, the isolation structure on the first side of the semiconductor substrate comprising a first shallow trench isolation (STI) structure, a second STI structure and a first region between the first STI structure and the second STI structure that is formed from a first type semiconductor, and an implant region formed from the first type semiconductor that is in contact with the first region and extends toward the second side of the semiconductor substrate;

and a backside trench isolation (BTI) structure extending from the second side of the semiconductor substrate toward the implant region and in contact with the implant region, wherein the first STI structure, the first region, the second STI structure, the implant region, and the BTI structure cooperatively form a continuous lateral isolation boundary between the first pixel region and the pixel transistor region.

18. The pixel cell of claim 17, further comprising a trench isolation structure extending from the second side toward the first side of the semiconductor substrate to contact the implant region.

19. The pixel cell of claim 17, wherein the first photodiode comprises a single photon avalanche diode (SPAD), and wherein the first type semiconductor comprises a p-type semiconductor.

20. The pixel cell of claim 17, wherein the at least one transistor is part of a CMOS transistor circuit.

* * * * *